(12) United States Patent
Mourant

(10) Patent No.: US 12,063,020 B2
(45) Date of Patent: *Aug. 13, 2024

(54) ZERO GLITCH DIGITAL STEP ATTENUATOR

(71) Applicant: MACOM Technology Solutions Holdings, Inc., Lowell, MA (US)

(72) Inventor: Jean-Marc Mourant, Santa Clara, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/989,732

(22) Filed: Nov. 18, 2022

(65) Prior Publication Data

US 2023/0080015 A1    Mar. 16, 2023

Related U.S. Application Data

(63) Continuation of application No. 17/319,161, filed on May 13, 2021, now Pat. No. 11,522,523.

(51) Int. Cl.

| | |
|---|---|
| *H03K 17/00* | (2006.01) |
| *H03H 11/24* | (2006.01) |
| *H03K 5/01* | (2006.01) |
| *H03K 17/16* | (2006.01) |

(Continued)

(52) U.S. Cl.
CPC ............ *H03H 11/245* (2013.01); *H03K 5/01* (2013.01); *H03K 17/164* (2013.01); *H03K 17/687* (2013.01); *H03K 17/6874* (2013.01); *H03K 17/693* (2013.01)

(58) Field of Classification Search
CPC ...... H03H 11/245; H03K 5/01; H03K 17/164; H03K 17/687; H03K 17/6874; H03K 17/693
See application file for complete search history.

(56) References Cited

U.S. PATENT DOCUMENTS

| | | | |
|---|---|---|---|
| 5,049,841 A * | 9/1991 | Cooper | H03H 11/245 333/81 R |
| 7,253,700 B1 | 8/2007 | Chiu | |

(Continued)

OTHER PUBLICATIONS

U.S. Appl. No. 17/319,161, filed May 13, 2021.
(Continued)

*Primary Examiner* — Tuan T Lam
(74) *Attorney, Agent, or Firm* — Sheridan Ross, PC

(57) ABSTRACT

A digital step attenuator (DSA) cell and related method are provided. The DSA cell includes a first branch comprising a first resistor connected, at a first side, to an input port and, at a second side, to an output port; a second resistor connected, at a first side, to the first resistor and, at a second side, to a first transistor and a third resistor connected, at a first side, to the first resistor and, at a second side, to a second transistor. Also included in the DSA cell is a second branch, in a parallel configuration with the first resistor, that includes a fourth resistor and a third transistor. Also included is a third branch, in a parallel configuration with the first resistor, that includes a fourth transistor. The first transistor, the second transistor, the third transistor, and the fourth transistor are configured to be operated independently.

20 Claims, 10 Drawing Sheets

(51) Int. Cl.
*H03K 17/687* (2006.01)
*H03K 17/693* (2006.01)

(56) References Cited

U.S. PATENT DOCUMENTS

| | | | |
|---|---|---|---|
| 7,525,395 B2 * | 4/2009 | Hwang | H03H 7/25 |
| | | | 333/81 R |
| 8,674,746 B1 * | 3/2014 | Staudinger | H03F 1/3258 |
| | | | 327/333 |
| 8,704,684 B2 | 4/2014 | Bawell et al. | |
| 9,374,078 B2 | 6/2016 | Bawell et al. | |
| 11,522,523 B1 | 12/2022 | Mourant | |
| 2014/0002214 A1 | 1/2014 | Bawell et al. | |
| 2015/0137913 A1 | 5/2015 | Costa | |
| 2016/0118959 A1 | 4/2016 | Atesal et al. | |
| 2017/0104471 A1 | 4/2017 | Shrivastava | |
| 2017/0207769 A1 | 7/2017 | Shrivastava | |
| 2021/0376823 A1 * | 12/2021 | Chen | H03K 17/693 |

OTHER PUBLICATIONS

Non-Final Office Action for U.S. Appl. No. 17/319,161 dated Apr. 4, 2022.
Notice of Allowance for U.S. Appl. No. 17/319,161, mailed Aug. 4, 2022.

\* cited by examiner

ZERO GLITCH DIGITAL STEP ATTENUATOR

CROSS-REFERENCE TO RELATED APPLICATIONS

This application is a Continuation of application Ser. No. 17/319,161 filed on May 13, 2021, the entire contents of which are incorporated herein by reference.

TECHNICAL FIELD

The subject disclosure relates generally to electrical circuit design and, in particular, to digital step attenuators and methods related thereto.

BACKGROUND

Digital Step Attenuators (DSAs) are used to achieve a target Radio Frequency (RF) signal power. DSAs are linear, precise, and have a low loss, once the DSA has settled. However, the situation is much different during the transition of the DSA from one level to another. For example, it is common for the RF signal level to experience a glitch (e.g., an overshoot and/or an undershoot) as the DSA switches in and out of various attenuation stages. The large variation in signal level (which can be up to around 10 decibels (dBs) or another value) is undesirable, because it can damage sensitive components, cause feedback loops to malfunction, or cause signal distortion. Accordingly, unique challenges exist related to DSAs and achieving the target RF signal power.

It is noted that the above-described description is merely intended to provide a contextual overview of DSAs and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In one or more embodiments, a method for selectively attenuating radio frequency signals of an attenuator circuit is provided. The attenuator circuit can include three branches comprising a first branch, a second branch, and a third branch. The first branch comprises a first transistor and a second transistor, the second branch comprises a third transistor, and the third branch comprises a fourth transistor. The method can include, based on the first transistor and the second transistor being in a closed state and the third transistor and the fourth transistor being in an opened state, and in response to an instruction to change a decibel value from a first value to a value of zero, causing the first value to decrease by a defined amount based on opening the first transistor, resulting in a second value. The method also can include causing the second value to decrease by the defined amount based on opening the second transistor, resulting in a third value. Further, the method can include causing the third value to decrease by the defined amount based on closing the third transistor, resulting in a fourth value. Additionally, the method can include causing the fourth value to decrease by the defined amount based on closing the fourth transistor, resulting in a fifth value, wherein the fifth value is zero.

Another embodiment relates to an attenuator circuit that includes an input port and an output port, a first branch, a second branch, and a third branch. The first branch includes a first resistor operatively connected, at a first side, to the input port and, at a second side, to the output port. The first branch also includes a second resistor operatively connected, at a first side, to the first resistor and, at a second side, to a first transistor. Further, the first branch includes a third resistor operatively connected, at a first side, to the first resistor and, at a second side, to a second transistor. The second branch is in a parallel configuration with the first resistor and includes a fourth resistor and a third transistor. The third branch is in a parallel configuration with the first resistor and the second branch. The third branch includes a fourth transistor. The first transistor, the second transistor, the third transistor, and the fourth transistor are configured to be operated independently.

A further embodiment relates to a method that includes independently operating a first transistor, a second transistor, a third transistor, and a fourth transistor of an attenuator cell. Respective state changes of the first transistor, the second transistor, the third transistor, and the fourth transistor do not change the respective states of the other transistors. The attenuator cell can include a first branch that includes a first resistor operatively connected at a first side to an input port and at a second side to an output port. The first branch also includes a second resistor operatively connected, at a first side, to the first resistor and, at a second side, to the first transistor. Further, the first branch includes a third resistor operatively connected, at a first side, to the first resistor and, at a second side, to the second transistor. The attenuator cell also includes a second branch comprising a fourth resistor in a series configuration with the third transistor. The second branch is in a parallel configuration with the first resistor. Also included in the attenuator cell is a third branch that includes a fifth transistor. The third branch is in a parallel configuration with the second branch. The method also includes causing the attenuator cell to generate 2.0 decibels based on the first transistor and the second transistor being in a first state and the third transistor and the fourth transistor being in a second state. The first state is a closed state, and the second state is an opened state.

DETAILED DESCRIPTION

Figure 1:
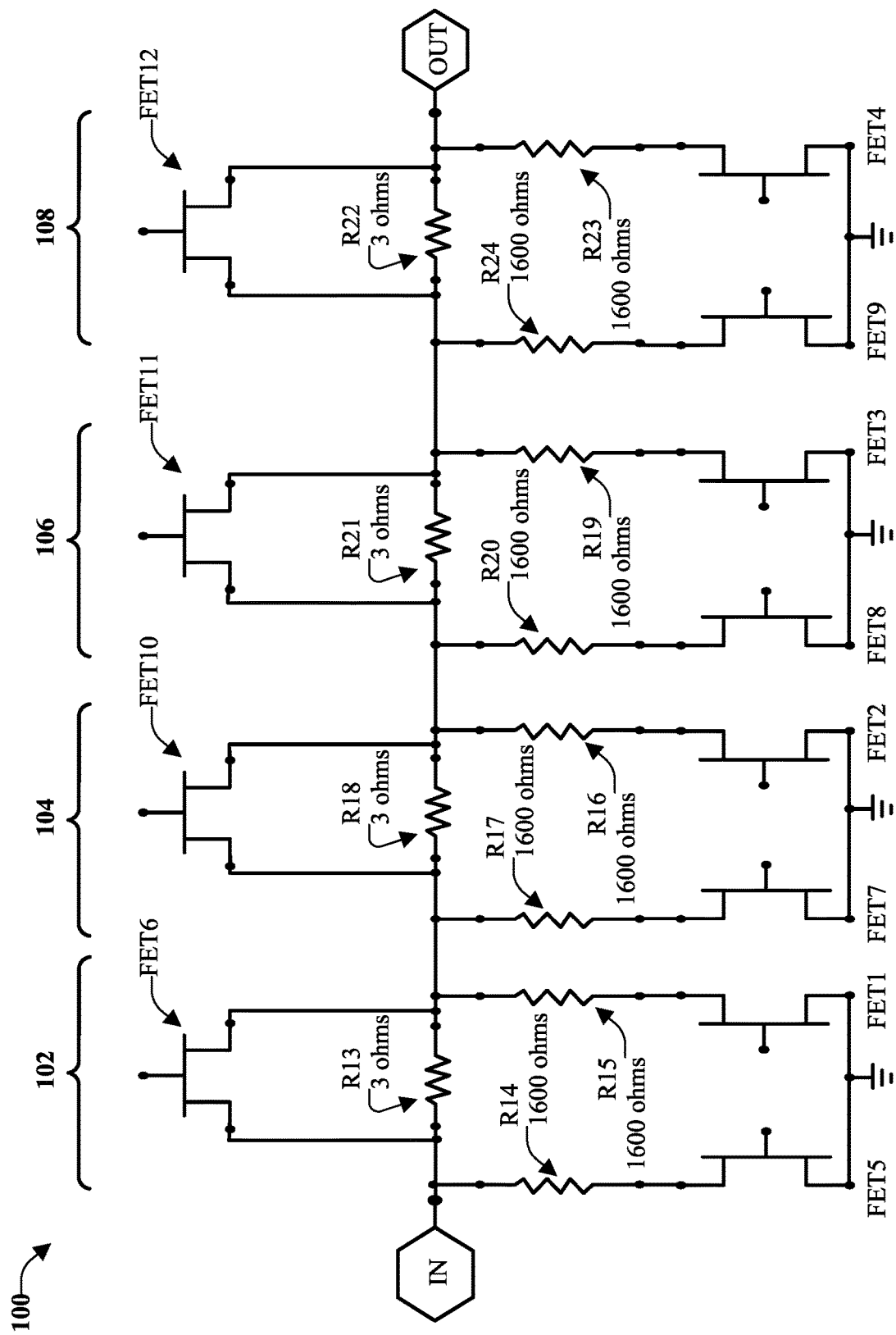
FIG. 1 illustrates a circuit diagram for an example digital step attenuator circuit.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

A conventional DSA architecture is a cascade of binary stages that can be switched in or out. For example, a 32 dB DSA includes a 16 dB stage, an 8 dB stage, a 4 dB stage, a 2 dB stage, a 1 dB stage, and, optionally, a 0.5 dB stage. Each attenuation stage (e.g., 16 dB, 8 dB, 4 dB, 2 dB, 1 dB, and 0.5 dB) has a 0 dB bypass. Any combination of these stages can provide a defined attenuation between zero and 31.5 dBs.

As mentioned, the RF signal level can experience a glitch (e.g., an overshoot and/or an undershoot) as the DSA switches in and out of various attenuation stages. The glitch becomes worse when the largest bits are added and/or subtracted. For example, to go from −16 dB to −15.5 dB, first the 16 dB stage is removed. Next, the 8 dB stage, the 4 dB stage, the 2 dB stage, the 1 dB stage, and the 0.5 dB stage are added. This process leads to a large attenuation variation during the transition (e.g., an 8 dB glitch can be experienced).

A few different approaches have been used in an attempt to solve this glitch issue. For example, a Voltage Controlled Attenuator (VCA) and a DAC can be utilized to drive the stages. The VCA has smooth continuous attenuation response and the points desired on the curve can be chosen and the voltage can be generated with a DAC. Challenges with this approach is the inaccuracy of the VCA, the slow response time of the DAC, and the poor linearity of the VCA.

Another approach involves a concept borrowed from fast DAC design: a hybrid binary-thermometer DSA architecture. If it is possible to avoid the large binary steps and convert the large binary steps to thermometer coded steps, the worst glitches are reduced. For example, a 32 dB DSA can be made with seven cascaded 4 dB stages plus a 2 dB binary stage, a 1 dB binary stage, and a 0.5 dB binary stage. The 6-bit control signals can be decoded to provide thermometer code for the seven 4 dB stages and binary code for the 3 binary stages. The worst glitch is now the transition between 4 dB and 3.5 dB, on average a 2 dB glitch. This approach works well but the glitch, although reduced, still exists.

As another approach, based on the use of a binary DSA, the addition and subtraction of attenuation needs to occur at the same time, which can minimize the glitch or make the glitch so short (in terms of time) that it is not noticeable. While this can deliver some benefits, it is difficult to achieve. Timing is dependent on process and temperature. Running the attenuation from low to high can have different timing from the reverse (e.g., from high to low). Even if the glitch were made short, it might not be short enough. Further, to obtain control of the timing, the control may have to be slowed down as compared to a different approach. In the end, there will be a remaining glitch.

In another approach, a thermometer coded DSA with a resolution size step can be utilized. As long as the decoder is glitch free, the DSA will have a monotonic response and no glitch. The drawback is the number of switches needed, which will reduce bandwidth and increase die area (e.g., a large amount of hardware is needed). For example, a 32 dB attenuator with a 0.5 dB step will require 64 pass transistors, compared to 7 pass transistors in a binary DSA. Thus, a large amount of hardware is necessary, which increases the die area (or footprint size).

FIG. 1 illustrates a circuit diagram for an example DSA circuit 100. The DSA circuit is a thermometer coded 2 dB attenuator with 0.5 dB step (4 stages), illustrated as a first stage 102, a second stage 104, a third stage 106, and a fourth stage 108.

In various devices, such as a radio, for example, the end user can be provided a way to change the signal strength (e.g., a signal level). Such control is necessary because conditions can vary, especially in a wireless context where the signal can fade in and out. Thus, the signal needs to be tracked, in order for the signal to be received and the attenuation can be adjusted to match the signal strength and a constant (or as constant as possible) signal can be output.

Some analog controlled attenuators can receive an input voltage and, based on that input voltage, the attenuation changes. These analog controlled attenuators operate without a glitch. In other words, these analog controlled attenuators are monotonic (e.g., move smoothly from state to state without being non-monotonic). However, analog controlled attenuators are slow and the analog voltage needs to be generated (e.g., using a computer, processor, Digital Analog Converter (DAC), and so on).

DSAs use bits directly instead of going through an analog voltage. Based, at least in part, on the bits, a state of attenuation is set. In order to use the bits, binary coding can be utilized (e.g., a binary coded attenuator). For example, a 32 dB attenuator would need 5 or 6 bits to achieve 32 dB (or 31.5 dB). A first bit is 16 dB, a second bit is 8 dB, a third bit is 4 dB, a fourth bit is 2 dB, a fifth bit is 1 dB, and, optionally, a sixth bit is 0.5 dB. With this combination of bits, that can be added together (or subtracted from one another), a device can be built, between 0 dB and 32 dB (e.g., 31.5 dB).

A thermometer encoded attenuator is different. There is no such thing as a binary bit of attenuation. Instead of adding bits together, the thermometer encoded attenuator operates similar to a thermometer, for example, it goes up or down degree by degree (or step by step). All the steps are the same value. The step value can be any defined value (e.g., 0.5 dB or another value). The thermometer encoded attenuator is operated in a smooth monotonic manner (e.g., goes up monotonically and goes down monotonically).

However, a challenge associated with a thermometer encoded attenuator is that there can be a large number of steps. For example, if the attenuator is a 32 dB attenuator and the step size is 0.5 dB, that results in 64 steps (e.g., each step increasing/decreasing by 0.5 dB). Each step requires its own physical hardware (e.g., resistors, switches, and so on), which makes the attenuator more complicated and larger, which in turn reduces any benefit that is gained due to the monotonic steps. Accordingly, a binary attenuator is more efficient than a thermometer encoded attenuator. For example, as discussed, a binary attenuator (e.g., a 32 dB attenuator) has only 5 or 6 steps (or stages) as compared to the 64 steps (or stages) of the thermometer encoded attenuator.

As another example with respect to conventional attenuators, to go from 16 dB attenuation to 15 dB attenuation, first the 16 dB stage needs to be removed (cannot just get to 15 dB). Then, the 8 dB stage, the 4 dB stage, the 2 dB stage, and the 1 dB stage are added. All these steps introduce a glitch because the signal will not be monotonic (e.g., removing the 16 dB stage is a large drop).

The various embodiments discussed herein retain the advantage of the thermometer encoded attenuator. Further, the various embodiments provide an attenuator that is monotonic (e.g., there is no glitch when implemented properly) while minimizing an amount of components necessary to create the attenuation circuit.

Figure 2:
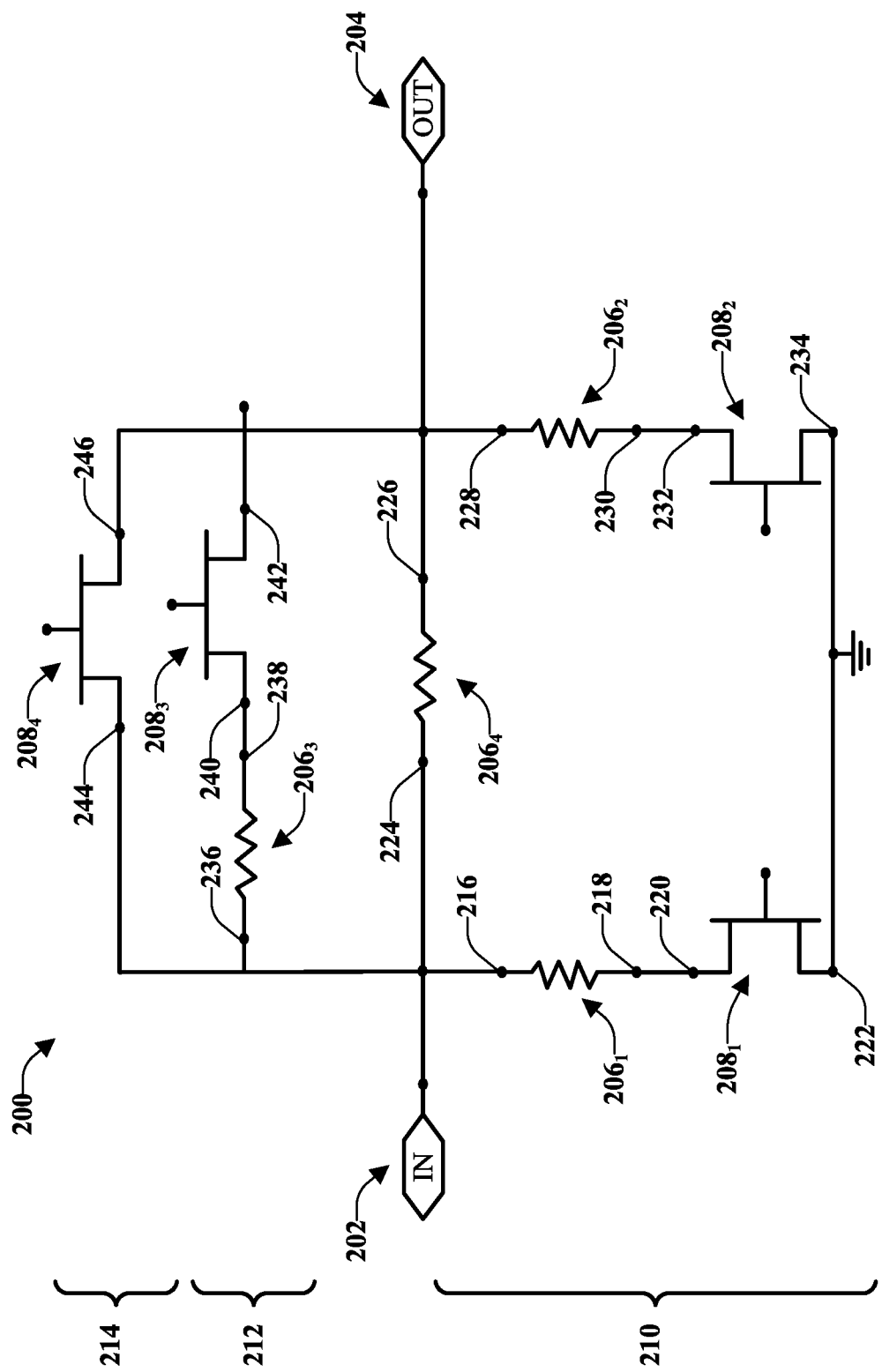
FIG. 2 illustrates an example, non-limiting, circuit diagram for a digital step attenuator cell according to an embodiment.

FIG. 2 illustrates an example, non-limiting, circuit diagram (DSA circuit 200) for a DSA cell according to an embodiment. It is noted that the DSA circuit 200 is a simplified circuit for purposes of explanation. The DSA circuit 200 can be embodied using any suitable circuit implementation, including but not limited to an on-chip component of a Very-Large-Scale Integration (VLSI) system, as a dedicated Integrated Circuit (IC) chip on which one or more instances of DSA circuit 200 are packaged, or other such implementations.

The DSA circuit 200 receives an input signal at input port 202 and generates a corresponding output signal at output port 204.

The DSA circuit 200 includes four resistors, labeled as first resistor $206_1$, second resistor $206_2$, third resistor $206_3$, and fourth resistor $206_4$. Also included in the DSA circuit 200 are four transistors, which can be Field Effect Transistors (FETs). The transistors are labeled as a first FET $208_1$, a second FET $208_2$, a third FET $208_3$, and a fourth FET $208_4$. It is noted that the transistors in the DSA circuit 200 are controlled independently from one another. For example, changing states of a transistor (e.g., opening or closing) a transistor does not affect a state of the other transistors in the circuit. Such independent operation mitigates and/or reduces the need to add large additional hardware that increases size and reduces bandwidth. It is noted that conventional attenuators (e.g., the attenuator of FIG. 1) switch all the transistors together (e.g., at a same time or at substantially the same time) in order to retain the matching impedance. However, in the case of the one or more embodiments, the transistors are independent of one another and, any impedance mismatch introduced by such independent switching is minimal. This small impedance mismatch is acceptable due to the reduced complexity and the monotonic nature of the one or more embodiments discussed herein as compared to conventional attenuators.

The resistors and transistors are arranged to form three branches, included as a first branch 210, a second branch 212, and a third branch 214. The first branch 210 includes the first resistor $206_1$, the first FET $208_1$, the second resistor $206_2$, and the second FET $208_2$, and the fourth resistor $206_4$. The components of the first branch are arranged in a PI configuration, or as a PI-section. However, in some implementations, the components of the first branch can be arranged in a different type of configuration, such as a Tee attenuator or as a bridge Tee attenuator. It is noted that the transistors of the PI-section (or other type of configuration) are controlled independently from one another and independently from the third FET $208_3$ and the fourth FET $208_4$ (or other FETs as will be discussed below). Thus, a change in state (e.g., switching from open to electrically shorted or vice versa) of one transistor does not cause a corresponding change to another transistor of the circuit).

In the first branch 210, a first side 216 of the first resistor $206_1$ is connected (e.g., operatively connected) to the input port 202. A second side 218 of the first resistor $206_1$ is connected to a first terminal 220 of the first FET $208_1$. A second terminal 222 of the first FET $208_1$ is connected to ground.

A first side 224 of the fourth resistor $206_4$ is connected to the input port 202 and to the first side 216 of the first resistor $206_1$. Further, a second side 226 of the fourth resistor $206_4$ is connect to the output port 204 and to a first side 228 of the second resistor $206_2$. A second side 230 of the second resistor $206_2$ is connected to a first terminal 232 of the second FET $208_2$. A second terminal 234 of the second FET $208_2$ is connected to ground.

For the second branch 212, a first side 236 of the third resistor $206_3$ is connected to the input port 202. The first side 236 of the third resistor $206_3$ is also connected to the first side 216 of the first resistor $206_1$ and the first side 224 of the fourth resistor $206_4$. A second side 238 of the third resistor $206_3$ is connected to a first terminal 240 of the third FET $208_3$. A second terminal 242 of the third FET $208_3$ is connected to a second side 226 of the fourth resistor $206_4$ and to the first side 228 of the second resistor $206_2$.

For the third branch, a first terminal 244 of the fourth FET $208_4$ is connected to the input port 202. The first terminal 244 of the fourth FET $208_4$ is also connected to the first side 236 of the third resistor $206_3$, the first side 224 of the fourth resistor $206_4$, and the first side 216 of the first resistor $206_1$. A second terminal 246 of the fourth FET $208_4$ is connected to the output port 204. Further, the second terminal 246 is connected to the second terminal 242 of the third FET $208_3$, the second side 226 of the fourth resistor $206_4$, and the first side 228 of the second resistor $206_2$.

Each branch (e.g., the first branch 210, the second branch 212, the third branch 214) can be operated independently (e.g., a state of one transistor can be changed without changing the respective states of the other transistors). For example, the first FET $208_1$ can be opened or closed irrespective of the states of the other FETs (e.g., the second FET $208_2$, the third FET $208_3$, the fourth FET $208_4$). Further, the second FET $208_2$ can be opened or closed irrespective of the states of the other FETs (e.g., the first FET $208_1$, the third FET $208_3$, the fourth FET $208_4$). The third FET $208_3$ can be opened or closed irrespective of the states of the other FETs (e.g., the first FET $208_1$, the second FET $208_2$, the fourth FET $208_4$). Additionally, the fourth FET $208_4$ can be opened or closed irrespective of the states of the other FETs (e.g., the first FET $208_1$, the second FET $208_2$, the third FET $208_3$).

The operations of the circuit will now be discussed. It is noted that the various embodiments are discussed with respect to 2 dB cells that have 0.5 dB steps. However, the disclosed embodiments are not limited to this implementation, instead the cells and/or the steps can be other values. However, it is noted that as the cell decibel value increases, there is a corresponding (minimal) increase in the impedance mismatch.

Initially, the first FET $208_1$ and the second FET $208_2$ can be in a closed state (e.g., electrically shorted) and the third FET $208_3$ and the fourth FET $208_4$ can be in an opened state. In this condition, the DSA circuit 200 produces 2 dB attenuation. To reduce the attenuation from 2 dB to 1.5 dB (e.g., a first reduction), a first shunt of a two dB PI section (e.g., the first FET $208_1$) can be switched to the opened state. For example, the first FET $208_1$ can be switched from the closed state to the opened state in order to obtain a 0.5 dB reduction in loss. After changing the state of the transistor, the attenuation is now 1.5 dBs.

To obtain another 0.5 dB reduction (e.g., a second reduction), the second shunt can be switched from the closed state to the opened state. For example, the second FET $208_2$ can be switched to the opened state from the closed state to obtain the additional 0.5 dB reduction in loss.

To obtain a further 0.5 dB reduction (e.g., a third reduction), the second branch 212 can be independently controlled. Thus, the third FET $208_3$ can be switched from the open state to the closed state. In order to further reduce the dB value by 0.5 (e.g., a fourth reduction), which reduces the total dB value to zero, the fourth FET $208_4$ can be closed.

It is noted that the above described implementation is for illustration purposes only. In an alternative implementation, to obtain the first 0.5 dB reduction, the second FET $208_2$ can be switched from the closed state to the opened state in order to obtain the 0.5 dB reduction in loss. Further to this implementation, to obtain the second 0.5 dB reduction, the first FET $208_1$ can be switched from the closed state to the opened state. Alternatively, to obtain the second 0.5 dB reduction, the third FET $208_3$ can be switched from the opened state to the closed state.

In another example implementation, to obtain the second reduction, the third FET $208_3$ can be switched from the opened state to the closed state. Further to this implementation, to obtain the third reduction, the transistor of the shunt (e.g., the first FET $208_1$ or the second FET $208_2$) that has not changed state (e.g., from the closed state to the opened state) can be changed. Thus, to obtain the third reduction, the first FET $208_1$ and the second FET $208_2$ are in the opened state and the third FET $208_3$ is in the closed state.

To increase the dB value from 0 dB to 2 dB, the following example operations can occur. Initially, the first FET $208_1$ and the second FET $208_2$ are in the opened state, and the third FET $208_3$ and the fourth FET $208_4$ are in the closed state. To increase the dB value by 0.5 dB, the fourth FET $208_4$ can be opened. To increase the dB by another 0.5 dB, the third FET $208_3$ can be opened. In order to obtain another 0.5 dB increase, the second FET $208_2$ can be closed. For another increase of 0.5 dB, the first FET $208_1$ can be closed.

According to various embodiments, a thermometer coded DSA is utilized with sixteen 2 dB stages (16×2 dB) (e.g., the DSA circuit 200 is implemented sixteen times). This is a hardware savings as compared to a DSA, as discussed above, which performs a similar function, but utilizes sixty-four 0.5 dB stages (64×0.5 dB stages).

Accordingly, instead of 64 pass transistors, the complete circuit (e.g., the DSA circuit 200 repeated 16 times) has 16 pass transistors. Further, instead of 128 shunts, the complete circuit has 32 shunts. On the other hand, the completed circuit has 16 series branches, each with a resistor (e.g., the third resistor $206_3$) and an FET (e.g., the third FET $208_3$).

It is noted that the third resistor $206_3$ should be switchable. However, the size of the FET (e.g., the third FET $208_3$) can be smaller than the bypass FET.

The following will provide example, non-limiting values for the components of the DSA circuit 200. It is noted that these values are for example purposes only and other values can be utilized according to some implementations. The first resistor $206_1$ can have a value of 400 ohms. The second resistor $206_2$ can have a value of 400 ohms. The third resistor $206_3$ can have a value of 11 ohms and the fourth resistor $206_4$ can have a value of 11 ohms. All the FETs can be sized to represent a fraction of the resistance they are in series with. For example, the third FET $208_3$ can be a 0.5 mm FET which is worth about 1.1 Ohm in the on state, or about 10% of the third resistor $206_3$. All other FETs would also be approximately 10% of their respective resistances.

The overshoot realized by the DSA circuit 200, since it is fully thermometer coded, at each step, only the defined step is added or subtracted. In this example, the defined step is 0.5 dBs. Thus, there is no overshoot and no glitches.

Figure 3:
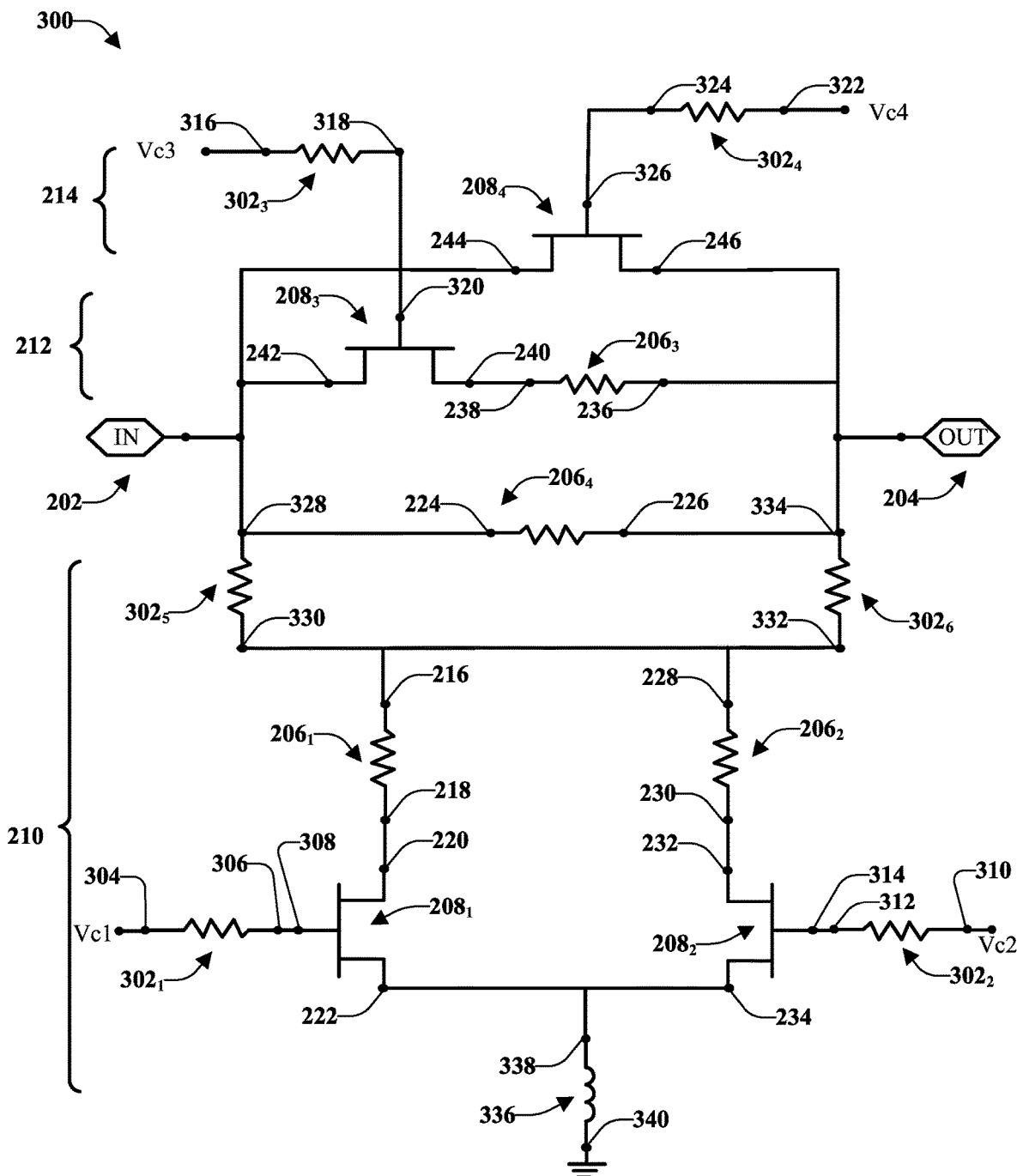
FIG. 3 illustrates an example, non-limiting circuit diagram for a bridge Tee cell implementation according to an embodiment.

FIG. 3 illustrates an example, non-limiting circuit diagram (DSA circuit 300) for a bridge Tee cell implementation according to an embodiment. Repetitive description of like elements employed in other embodiments described herein is omitted for sake of brevity. It is noted that the DSA circuit 300 is a simplified circuit for purposes of explanation. The DSA circuit 300 can be embodied using any suitable circuit implementation, including but not limited to an on-chip component of a VLSI system, as a dedicated IC chip on which one or more instances of DSA circuit 300 are packaged, or other such implementations. For some examples, the FET and resistor have been swapped in a given branch (e.g., the second branch 212). In practice, the configuration of the FET and resistor in a given branch does not change the functionality of the DSA circuit.

Various embodiments provided herein use a Pi attenuator as the basic attenuator cell. Tee cell attenuators are less popular because such attenuator use more series FETs and have more loss. However, Tee cell attenuators can also be utilized with the embodiments provided herein. Another option is the bridge Tee cell which has a single shunt FET. The proposed approach can also be used with the bridge Tee cell (as illustrated in FIG. 3). The DSA circuit 300 is similar to the DSA circuit 200 of FIG. 2, except for some additional Ohm resistors and some slightly different resistor values.

The DSA circuit 300 includes a fifth resistor $302_1$, a sixth resistor $302_2$, a seventh resistor $302_3$, and an eighth resistor $302_4$. In further detail, a first side 304 of the fifth resistor $302_1$ is connected to a voltage Vc1 and a second side 306 of the fifth resistor $302_1$ is connected to a third terminal 308 (e.g., a gate) of the first FET $208_1$. A first side 310 of the sixth resistor $302_2$ is connected to a second voltage Vc2 and a second side 312 of the sixth resistor $302_2$ is connected to a third terminal 314 (e.g., a gate) of the second FET $208_2$.

A first side 316 of the seventh resistor $302_3$ is connected to a third voltage Vc3 and a second side 318 of the seventh resistor $302_3$ is connected to a third terminal 320 (e.g., gate) of the third FET $208_3$. Further, a first side 322 of the eighth resistor $302_4$ is connected to a fourth voltage Vc4 and a second side 324 of the eighth resistor $302_4$ is connected to a third terminal 326 (e.g., gate) of the fourth FET $208_4$ The DSA circuit also includes a ninth resistor $302_5$ and a tenth resistor $302_6$. As illustrated, a first side 328 of the ninth resistor $302_5$ can be connected to the input port 202, a first side 224 of the fourth resistor $206_4$, the second terminal 242 of the third FET $208_3$, and the first terminal 244 of the fourth FET $208_4$. A second side 330 of the ninth resistor $302_5$ is connected to the first side 216 of the first resistor $206_1$, the first side 228 of the second resistor $206_2$, and a first side 332 of the tenth resistor $302_6$. The first side 332 of the tenth resistor $302_6$ is connected to the first side 228 of the second resistor $206_2$ and the first side 216 of the first resistor $206_1$. A second side 334 of the tenth resistor $302_6$ is connected to the second side 226 of the fourth resistor $206_4$, the output port 204, the first side 236 of the third resistor $206_3$, and the second terminal 246 of the fourth FET $208_4$.

For some examples, the FET (e.g., the third FET $208_3$) and the resistor (e.g., the third resistor $206_3$) have been swapped in a given branch (e.g., the second branch 212). In practice, the configuration of the FET and resistor in a given branch does not change the functionality of the DSA circuit. In the illustrated example, the second terminal 242 of the third FET $208_3$ is illustrated as being connected to the input port 202 and the first terminal 244 of the fourth FET $208_4$. Further to this example, the first side 236 of the third resistor $206_3$ is illustrated as being connected to the output port 204 and the second terminal 246 of the fourth FET $208_4$.

The DSA circuit 300 also includes an inductor 336 connected at a first side 338 to the second terminal 222 of the first FET $208_1$ and to the second terminal 234 of the second FET $208_2$. A second side 340 of the inductor 336 is connected to ground.

The following will provide example, non-limiting values for the components of the DSA circuit 300. It is noted that these values are for example purposes only and other values can be utilized according to some implementations. The first resistor $206_1$ can have a value of 360 ohms. The second resistor $206_2$ can have a value of 360 ohms. The third resistor $206_3$ can have a value of 13 ohms and the fourth resistor $206_4$ can have a value of 13 ohms. The fifth resistor $302_1$, the sixth resistor $302_2$, the seventh resistor $302_3$ and the eighth resistor $302_4$ can have respective values of 30,000 (30K) ohms. The ninth resistor $302_5$ and the tenth resistor $302_6$ can have respective values of 50,000 (30K) ohms. Further, the inductor 336 can have a value of 2 nanoHenries (2 nH). Thus, the DSA circuit 300 is similar to the DSA circuit 200 of FIG. 2, except for the additional 50 Ohm resistors and some slightly different resistor values.

Figure 4:
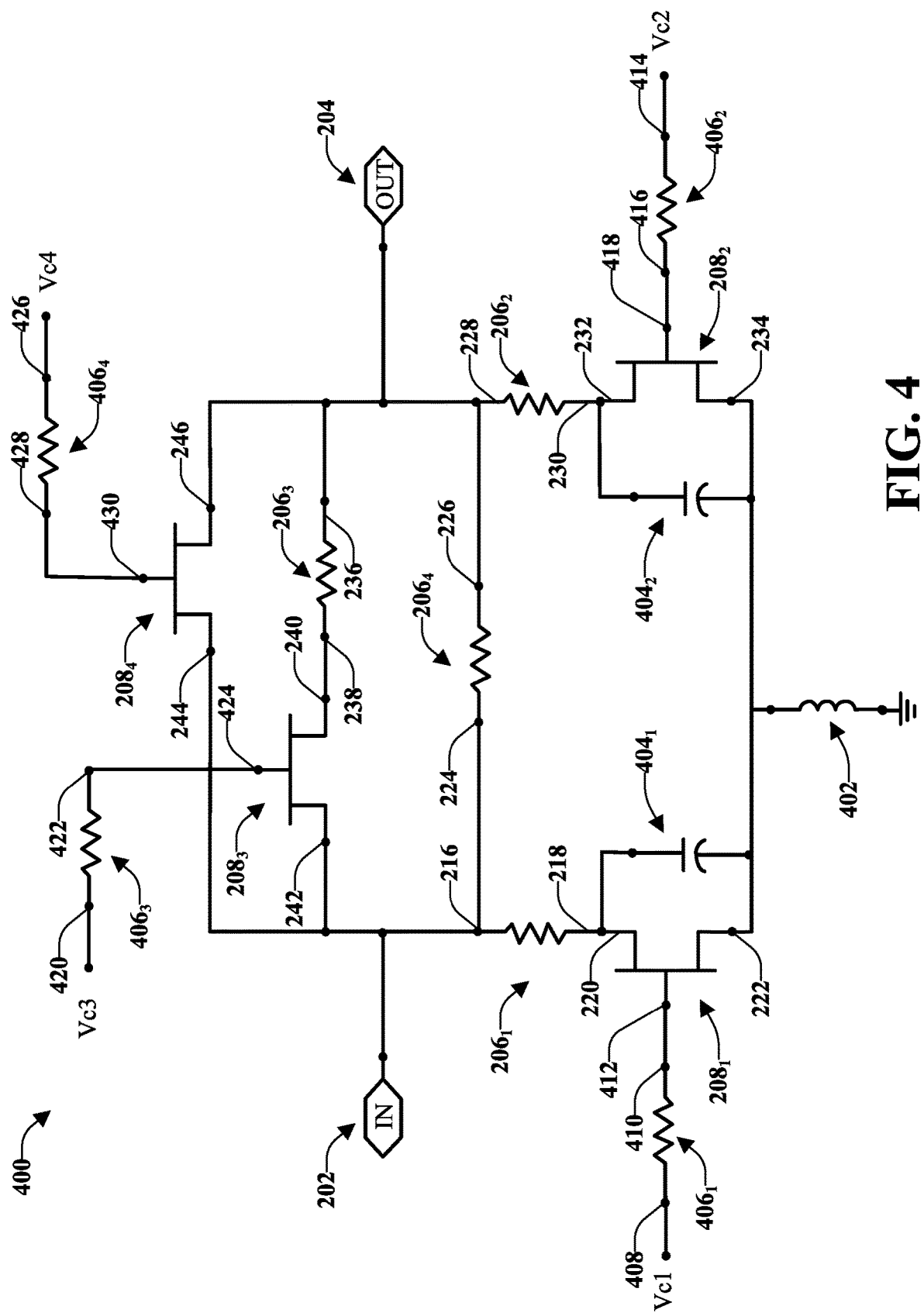
FIG. 4 illustrates another example, non-limiting, circuit diagram for a digital step attenuator cell according to an embodiment.

FIG. 4 illustrates another example, non-limiting, circuit diagram for a DSA cell (DSA circuit 400) according to an embodiment. Repetitive description of like elements employed in other embodiments described herein is omitted for sake of brevity. It is noted that the DSA circuit 400 is a simplified circuit for purposes of explanation. The DSA circuit 400 can be embodied using any suitable circuit implementation, including but not limited to an on-chip component of a VLSI system, as a dedicated IC chip on which one or more instances of DSA circuit 400 are packaged, or other such implementations. As previously noted, for some examples, the FET and resistor have been swapped in a given branch. In practice, the configuration of the FET and resistor in a given branch does not change the functionality of the DSA circuit.

The DSA circuit 400 is similar to the DSA circuit 200 of FIG. 2. The DSA circuit 400 includes the 2 dB cell with parasitic elements. Further, for the DSA circuit 400 there are reactive elements that will add phase delay. Thus, the DSA circuit 400 includes an inductor 402, which provides a parasitic ground inductance. Further, the DSA circuit 400 includes two capacitors, labeled as first capacitor $404_1$ and second capacitor $404_2$. The first capacitor $404_1$ and the second capacitor $404_2$ provide off state parasitic FET capacitance (e.g., shunt off FET capacitances). Further, the DSA circuit 400 includes a fifth resistor $406_1$, a sixth resistor $406_2$, a seventh resistor $406_3$, and an eighth resistor $406_4$. The ground inductance is most visible in a high attenuation state and the off capacitance in the zero attenuation state.

In further detail, a first side 408 of the fifth resistor $406_1$ is connected to a first voltage Vc1 and the second side 410 of the fifth resistor $406_1$ is connected to a third terminal 412 (e.g., a gate) of the first FET $208_1$. The first capacitor $404_1$ is connected in a parallel configuration with the first FET $208_1$. Further, a first side 414 of the sixth resistor $406_2$ is connected to a second voltage Vc2 and a second side 416 of the sixth resistor $406_2$ is connected to a third terminal 418 (e.g., a gate) of the second FET $208_2$. The second capacitor $404_2$ is connected in a parallel configuration with the second FET $208_2$.

A first side 420 of the seventh resistor $406_3$ is connected to a third voltage Vc3 and a second side 422 of the seventh resistor $406_3$ is connected to a third terminal 424 (e.g., gate) of the third FET $208_3$. Further, a first side 426 of the eighth resistor $406_4$ is connected to a fourth voltage Vc4 and a second side 428 of the eighth resistor $406_4$ is connected to a third terminal 430 (e.g., gate) of the fourth FET $208_4$.

The following will provide example, non-limiting values for the components of the DSA circuit 400. It is noted that these values are for example purposes only and other values can be utilized according to some implementations. The first resistor $206_1$ and the second resistor $206_2$ can have respective values of 400 ohms. The third resistor $206_3$ and the fourth resistor $206_4$ can have respective values of 11 ohms. The fifth resistor $406_1$, the sixth resistor $406_2$, the seventh resistor $406_3$ and the eighth resistor $406_4$ can have respective values of 30,000 (30K) ohms. Further, the inductor 402 can have a value of 2 nH.

Figure 5:
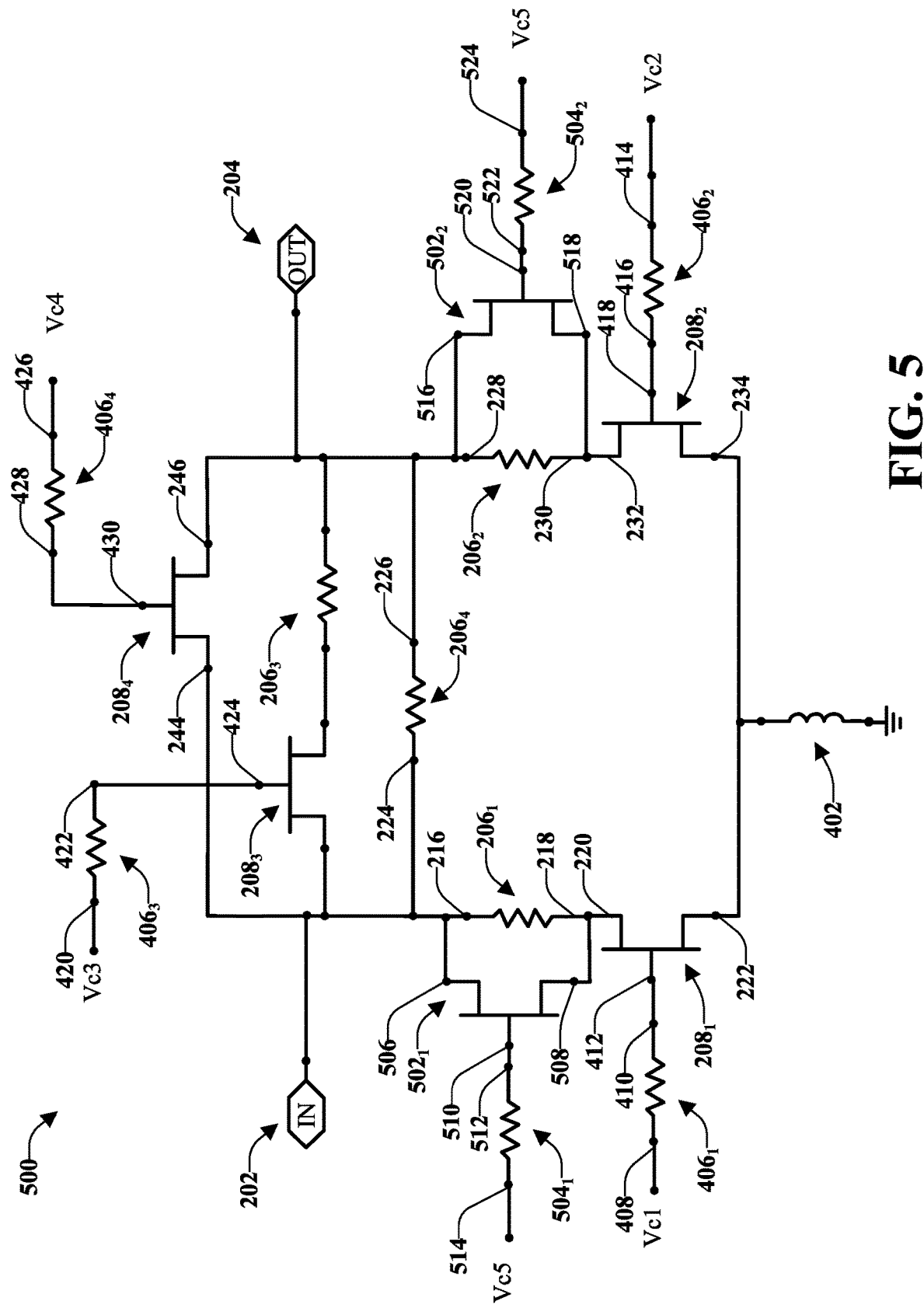
FIG. 5 illustrates another example, non-limiting, circuit diagram for an attenuator cell with phase compensation field effect transistors according to an embodiment.

FIG. 5 illustrates another example, non-limiting, circuit diagram for a DSA cell (DSA circuit 500) that includes an attenuator cell with phase compensation field effect transistors according to an embodiment. It is noted that the DSA circuit 500 is a simplified circuit for purposes of explanation. Repetitive description of like elements employed in other embodiments described herein is omitted for sake of brevity. The DSA circuit 500 can be embodied using any suitable circuit implementation, including but not limited to an on-chip component of a VLSI system, as a dedicated IC chip on which one or more instances of DSA circuit 500 are packaged, or other such implementations.

As illustrated another FET is added to the shunt branches. For example, a fifth FET $502_1$ and a sixth FET $502_2$ are included in the DSA circuit 500. Further, the DSA circuit 500 includes a ninth resistor $504_1$ and a tenth resistor $504_2$. By way of example, and not limitation, the ninth resistor $504_1$ and the tenth resistor $504_2$ can comprise respective values of 30K ohms.

The fifth FET $502_1$ is connected in parallel with the first resistor $206_1$. A first terminal 506 of the fifth FET $502_1$ is connected to the input port 202. A second terminal 508 of the fifth FET $502_1$ is connected to the first terminal 220 of the first FET $208_1$ and the second side 218 of the first resistor $206_1$. A third terminal 510 (e.g., the gate) of the fifth FET $502_1$ is connected to a first side 512 of the ninth resistor $504_1$. A second side 514 of the ninth resistor $504_1$ is connected to a fifth voltage Vc5.

Further sixth FET $502_2$ is connected in parallel with the second resistor $206_2$. A first terminal 516 of the sixth FET $502_2$ is connected to the output port 204. A second terminal 518 of the sixth FET $502_2$ is connected to the first terminal 232 of the second FET $208_2$ and the second side 230 of the second resistor $206_2$. A third terminal 520 (e.g., the gate) of the sixth FET $502_2$ is connected to a first side 522 of the tenth resistor $504_2$. A second side 524 of the tenth resistor $504_2$ is connected to the fifth voltage Vc5.

It is noted that the gate resistors discussed with various embodiments are optional. Further, gate resistors can be utilized in the DSA circuit 200 of FIG. 2, although not illustrated.

In the zero attenuation state, the FET is on, shunting the lossy resistor. In the high attenuation state, the off capacitance cancels out the ground inductance, keeping the phase constant.

Various issues can be experienced with some attenuator stages. For example, an issue can be that the insertion phase is different at different attenuation steps. Another issue can be that a 0 dB insertion loss is increased at higher frequencies because the shunt resistance is still there connected to the input through a capacitor. One or more embodiments provided herein can overcome these as well as other issues. It is noted that an ideal attenuator cell has no phase shift in any state, since there are only resistors to work with.

Figure 6:
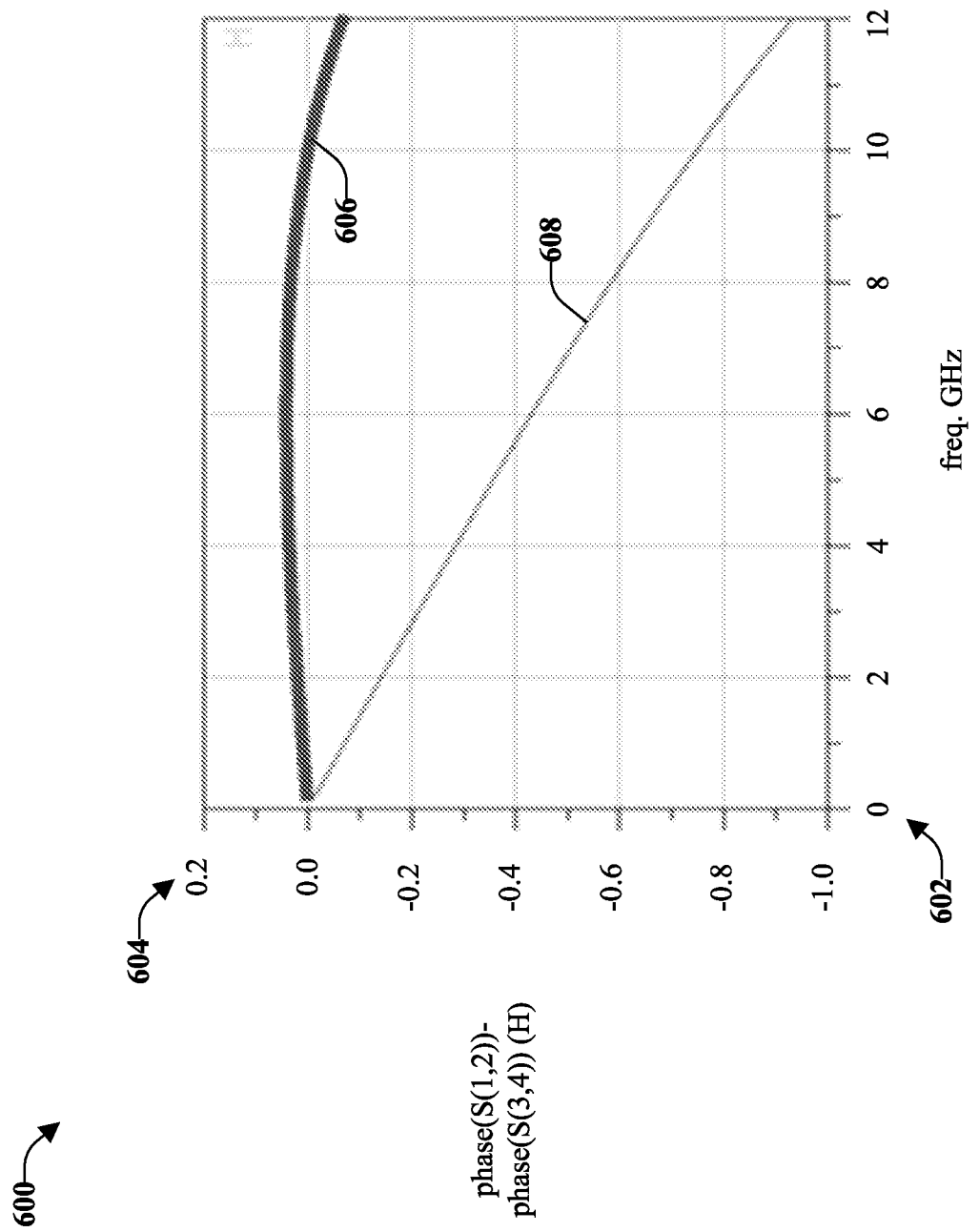
FIG. 6 illustrates an example, non-limiting, graph of a 2 dB cell phase difference from 0 dB to 2 dB (deg).
Figure 7:
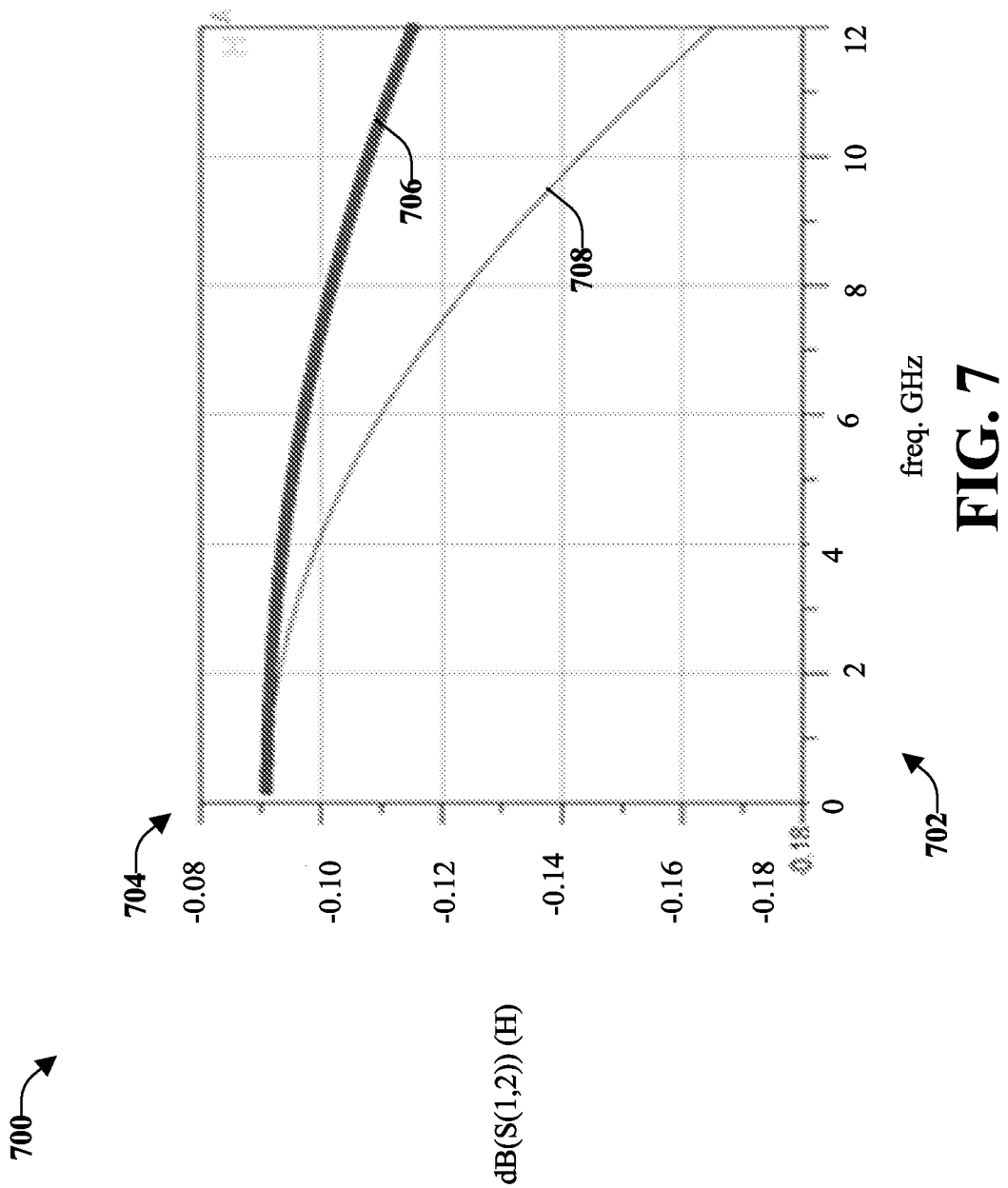
FIG. 7 illustrates an example, non-limiting, graph of a 2 dB cell min insertion loss (dB).

FIGS. 6 and 7 illustrate example, non-limiting simulation results according to an embodiment. More specifically, FIG. 6 illustrates an example, non-limiting, graph 600 of a 2 dB cell phase difference from 0 dB to 2 dB (deg). Illustrated on the horizontal axis is frequency 602, which is represented in Gigahertz (GHz). Illustrated on the vertical axis is the phase 604, which is represented as (S(1,2))-phases(S(3,4)). First line 606 illustrates the simulation with compensation and second line 608 illustrates the simulation results without compensation (no compensation).

FIG. 7 illustrates an example, non-limiting, graph 700 of a 2 dB cell min insertion loss (dB). Illustrated on the horizontal axis is frequency 702, which is represented in Gigahertz (GHz). Illustrated on the vertical axis is decibels 704, which is represented as (dB(S(1,2)). First line 706 illustrates the simulation with compensation and second line 708 illustrates the simulation results without compensation (no compensation).

As discussed with respect to FIG. 5, the new switches (e.g., the fifth FET $502_1$ and the sixth FET $502_2$) are helpful but, if care is not taken, the switches can introduce some glitching. For example, there are two FETs (e.g., the first FET $208_1$ and the fifth FET $502_1$; and the second FET $208_2$ and the sixth FET $502_2$) in series that are directly connected to ground. If, at any time, the two FETs are both on, the attenuation will be much more than 2 dB and a glitch will occur. In normal operation, one is on and the other is off (e.g., the first FET $208_1$ is one and the fifth FET $502_1$ is off, the second FET $208_2$ is on and the sixth FET $502_2$ is off, or vice versa). However, an issue can arise during the transition to a new state.

There are possible solutions listed below. It is worth noting that phase compensation is not critical to any one minimum step. Phase compensation should occur before it can accumulate too much. A solution includes using non overlapping clocks to switch the two FETs (e.g., the combination of the first FET $208_1$ and the fifth FET $502_1$, and the combination of the second FET $208_2$ and the sixth FET $502_2$). For example, a first group of clocks can be configured to switch the first transistor (e.g., the first FET $208_1$) and the fifth transistor (e.g., fifth FET $502_1$) at different times and a second group of clocks can be configured to switch the second transistor (e.g., the second FET $208_2$) and the sixth transistor (e.g., sixth FET $502_2$) at different times.

The non-overlapping clocks add some complexity and slow down the switching time moderately.

Commanding the compensation FETs with the previous or the following adjacent step (which is series branch switching). This way the two FETs are never switched at (exactly or at substantially) the same time when taking an adjacent step. This is a proper solution, but the problem remains for larger steps where a number of shunt legs could switch at the same time and the two shunt FETs could be both on for some time.

Thus, an additional delay can be added to the series or the shunt branch to make sure they do not switch at the same time. This is also a proper solution with the drawback of longer switching times.

Figure 8:
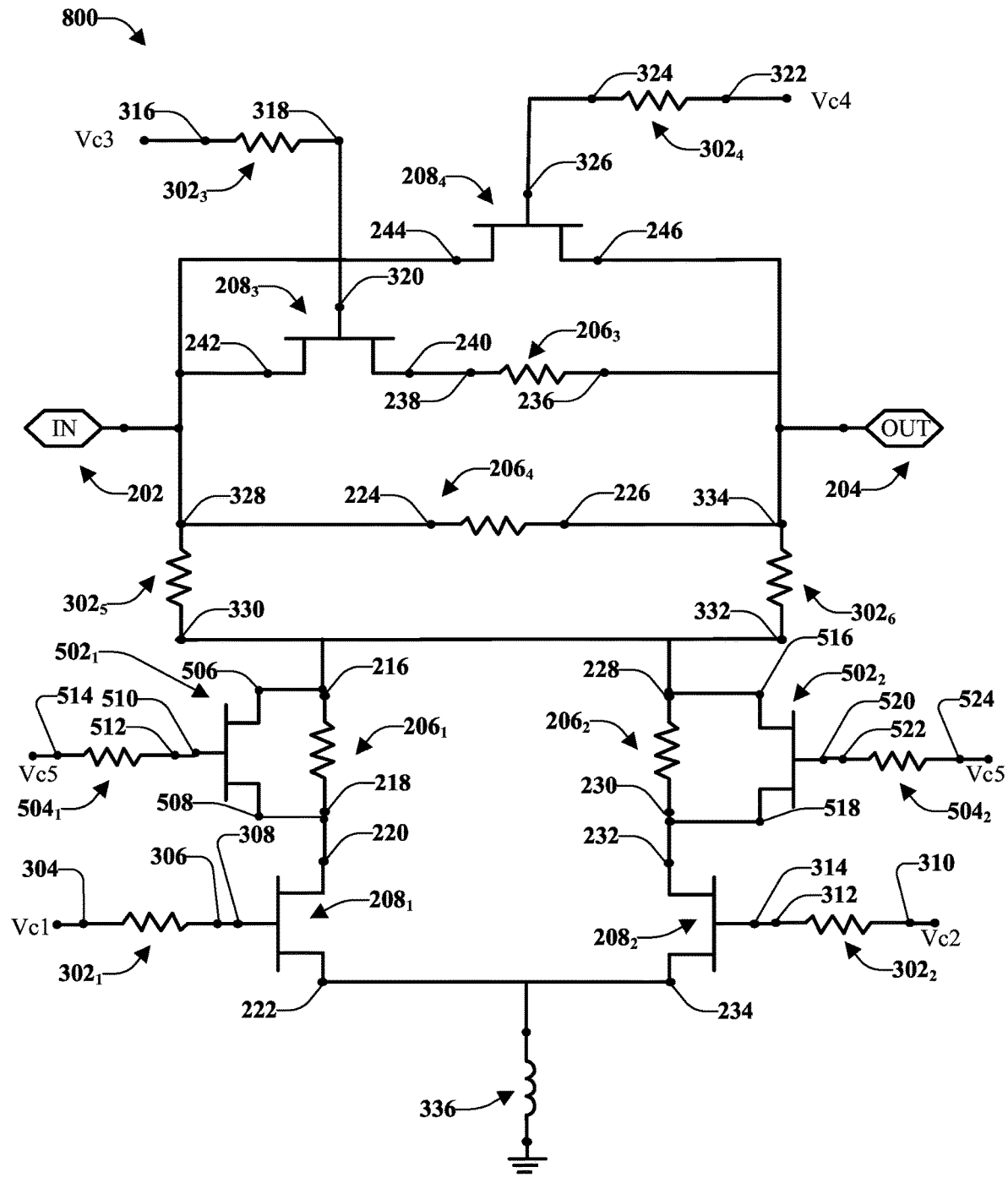
FIG. 8 illustrates an example, non-limiting, circuit diagram a bridge Tee cell implementation of the compensation FETs according to an embodiment.

Further, a bridge Tee implementation can also be utilized according to some implementations. FIG. 8 illustrates an example, non-limiting, circuit diagram (DSA circuit 800) for a bridge Tee cell implementation of the compensation FETs according to an embodiment. Repetitive description of like elements employed in other embodiments described herein is omitted for sake of brevity. It is noted that the DSA circuit 800 is a simplified circuit for purposes of explanation. The DSA circuit 800 can be embodied using any suitable circuit implementation, including but not limited to an on-chip component of a VLSI system, as a dedicated IC chip on which one or more instances of DSA circuit 800 are packaged, or other such implementations.

Methods that can be implemented in accordance with the disclosed subject matter, will be better appreciated with reference to the above flow charts. While, for purposes of simplicity of explanation, the methods are shown and described as a series of acts or blocks, it is to be understood and appreciated that the disclosed aspects are not limited by the number or order of blocks, as some blocks can occur in different orders and/or at substantially the same time with other blocks from what is depicted and described herein. Moreover, not all illustrated blocks can be required to implement the disclosed methods. It is to be appreciated that the functionality associated with the blocks can be implemented by software, hardware, a combination thereof, or any other suitable means (e.g. device, system, process, component, and so forth). Additionally, it should be further appreciated that the disclosed methods are capable of being stored on an article of manufacture to facilitate transporting and transferring such methods to various devices. Those skilled in the art will understand and appreciate that the methods could alternatively be represented as a series of interrelated states or events, such as in a state diagram.

Figure 9:
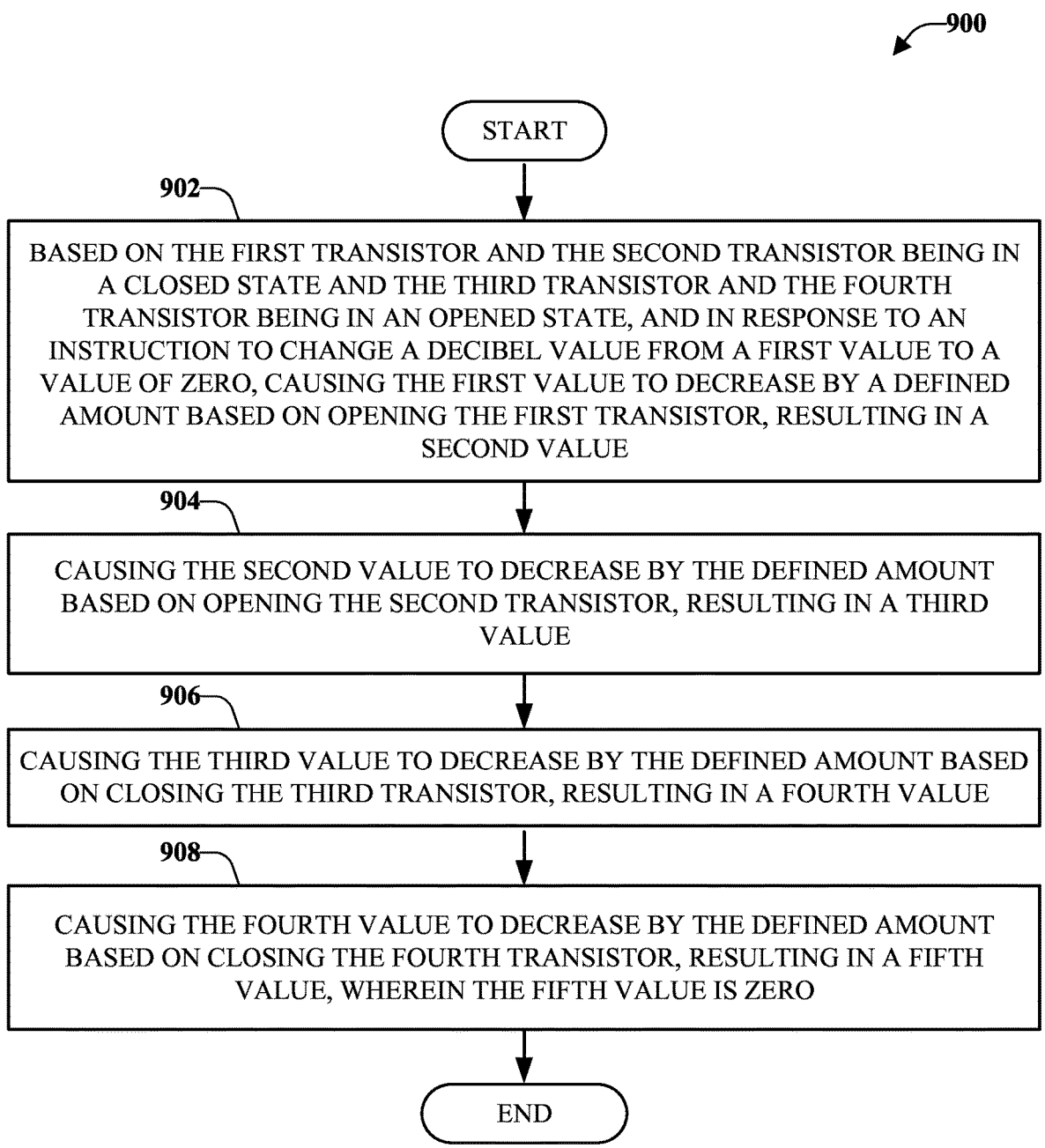
FIG. 9 illustrates an example, non-limiting, method for facilitating selectively attenuating radio frequency signals in accordance with one or more embodiments described herein.

FIG. 9 illustrates an example, non-limiting, computer-implemented method 900 for facilitating selectively attenuating radio frequency signals in accordance with one or more embodiments described herein. The computer-implemented method 900 can be implemented by a device that includes a circuit that includes one or more 2 dB thermometer coded stages (e.g., the DSA circuit 200, the DSA circuit 300, the DSA circuit 400, the DSA circuit 500, and the DSA circuit 800), or another device that includes a processor. Repetitive description of like elements employed in other embodiments described herein is omitted for sake of brevity.

For example, the method can facilitate selectively attenuating radio frequency signals of an attenuator circuit comprising three branches. The three branches can include a first branch (e.g., the first branch 210), a second branch (e.g., the second branch 212), and a third branch (e.g., the third branch 214). The first branch can include a first transistor (e.g., the first FET $208_1$) and a second transistor (e.g., the second FET $208_2$), the second branch can include a third transistor (e.g., the third FET $208_3$), and the third branch can include a fourth transistor (e.g., the fourth FET $208_4$).

Based on the first transistor and the second transistor being in a closed state and the third transistor and the fourth transistor being in an opened state, and in response to an instruction to change a decibel value from a first value to a value of zero, at 702 the method causes the first value to decrease by a defined amount based on opening the first transistor, resulting in a second value.

At 904, the second value is caused to decrease by the defined amount based on opening the second transistor, resulting in a third value. Further, at 906, the method causes the fourth value to decrease by the defined amount based on closing the fourth transistor, resulting in a fifth value, wherein the fifth value is zero.

Further, the method can include configuring the first transistor, the second transistor, the third transistor, and the fourth transistor to operate independently from one another. Thus, a change in state (e.g., from open to shorted) of a particular transistor does not change a state of the other transistors. This is different than conventional attenuator cells where all the transistors change state at substantially the same time.

According to some implementations, the method can include operatively connecting a first capacitor (e.g., the first capacitor $404_1$) in a parallel configuration with the first transistor. Further to these implementations, the method can include operatively connecting a second capacitor (e.g., the second capacitor $404_2$) in a parallel configuration with the second transistor.

In some implementations, the method can include operatively connecting a fifth transistor (e.g., the fifth FET $502_1$) in a parallel configuration with the first resistor (e.g., the first resistor $206_1$). The first resistor is operatively connected between the first transistor and an input port. Further, the method can include operatively connecting a sixth transistor (e.g., the sixth FET $502_2$) in a parallel configuration with a second resistor (e.g., the second resistor $206_2$). The second resistor is operatively connected between the second transistor and the output port.

In an example, the attenuator circuit is a 2 decibel cell of an attenuator, and wherein the defined amount is 0.5 dB. However, it is noted that the cell can be another decibel cell and/or the defined amount can be another decibel among. In another example, the first transistor, the second transistor, the third transistor, and the fourth transistor are field-effect transistors.

Figure 10:
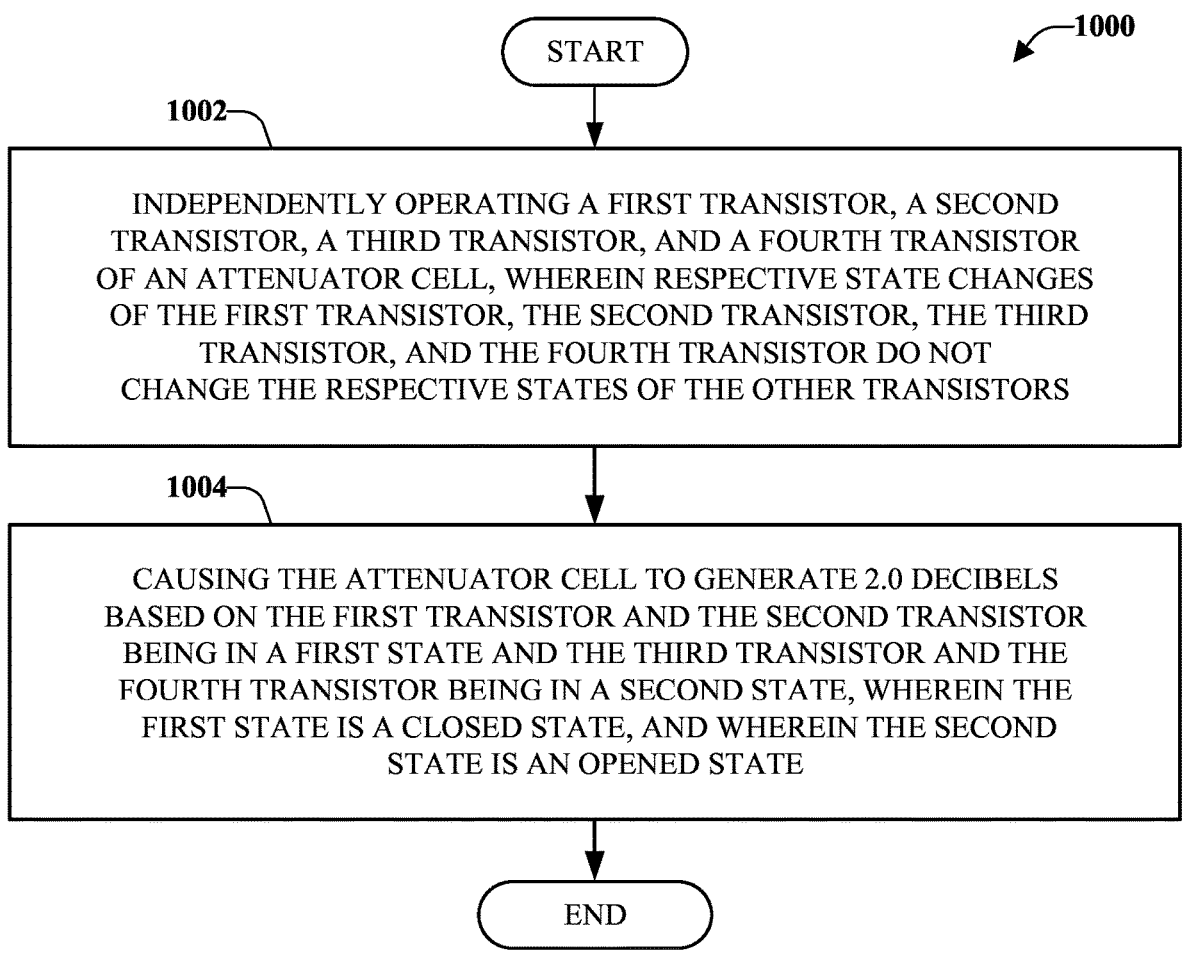
FIG. 10 illustrates another example, non-limiting, method for facilitating operation for selectively attenuating radio frequency signals in accordance with one or more embodiments described herein.

FIG. 10 illustrates another example, non-limiting, computer-implemented method 1000 for facilitating operation for selectively attenuating radio frequency signals in accordance with one or more embodiments described herein. The computer-implemented method 1000 can be implemented by a device that includes a circuit that includes one or more 2 dB thermometer coded stages (e.g., the DSA circuit 200, the DSA circuit 300, the DSA circuit 400, the DSA circuit 500, and the DSA circuit 800), or another device that includes a processor. Repetitive description of like elements employed in other embodiments described herein is omitted for sake of brevity.

The method starts at 802 with independently operating a first transistor, a second transistor, a third transistor, and a fourth transistor of an attenuator cell. Respective state changes of the first transistor, the second transistor, the third transistor, and the fourth transistor do not change the respective states of the other transistors.

The attenuator cell can include a first branch that can include a first resistor connected at a first side to an input port and at a second side to an output port. The first branch can also include a second resistor connected, at a first side, to the first resistor and, at a second side, to the first transistor. Further, the first branch can include a third resistor connected, at a first side, to the first resistor and, at a second side, to the second transistor. The attenuator cell can also include a second branch comprising a fourth resistor in a series configuration with the third transistor. The second branch is in a parallel configuration with the first resistor. Further, the attenuator cell can include a third branch comprising a fifth transistor. The third branch is in a parallel configuration with the second branch.

At 1004 the method can cause the attenuator cell to generate 2.0 decibels based on the first transistor and the second transistor being in a first state and the third transistor and the fourth transistor being in a second state. The first state is a closed state, and the second state is an opened state.

The method can include, according to some implementations, initializing the attenuator cell at a first decibel level. The initializing can include placing the first transistor and the second transistor in the second state and placing the third transistor and the fourth transistor in the first state. The first decibel level can be zero decibels. Further to these implementations, the method can include causing a first decibel increase in the attenuator cell based on placing the fourth transistor in the second state, resulting in a second decibel level.

Continuing the above implementations, the method can include causing a second decibel increase in the attenuator cell based on placing the third transistor in the second state, resulting in a third decibel level. The first decibel increase and the second decibel increase are a same increase level.

Further to the above implementations, the method can include causing a third decibel increase in the attenuator cell based on placing the second transistor in the first state, resulting in a fourth decibel value. the third decibel increase is the same increase level as the first decibel increase and the second decibel increase.

With respect to the above implementations, the method can include causing a fourth decibel increase in the attenuator cell based on placing the first transistor in the first state, resulting in a fifth decibel value. The first decibel increase, the second decibel increase, the third decibel increase, and the fourth decibel increase are a same increase level.

In some implementations, the method can include initializing the attenuator cell at a first decibel level, wherein the initializing comprises placing the first transistor and the second transistor in the first state and placing the third transistor and the fourth transistor in the second state. The first decibel level is 2.0 decibels. Further to these implementations, the method can include causing a first decibel decrease in the attenuator cell based on placing the first transistor in the first state, resulting in a second decibel level.

Continuing the above implementations, the method can include causing a second decibel decrease in the attenuator cell based on placing the second transistor in the first state, resulting in a third decibel level. The first decibel decrease and the second decibel decrease are a same decrease level.

Further to the above implementations, the method can include causing a third decibel increase in the attenuator cell based on placing the third transistor in the second state, resulting in a fourth decibel value. The first decibel decrease, the second decibel decrease, and the third decibel decrease are the same decrease level.

With respect to the above implementations, the method can include causing a fourth decibel decrease in the attenuator cell based on placing the fourth transistor in the second state, resulting in a fifth decibel value. The first decibel decrease, the second decibel decrease, the third decibel decrease, and the fourth decibel decrease are a same decrease level.

It is noted that although various embodiments are discussed with increasing the decibels from a defined value to zero, or vice versa. The disclosed embodiments are not limited to this implementation. Instead, the attenuator cell can be initialized at any desired value between zero and the maximum value of the attenuator cell based on the respective states of the transistors. Further, the states of the transistors can be changed to any level between zero and the maximum value of the attenuator cell as function of the respective states of the transistors. Additionally, although discussed with respect to individual steps or change values, in some implementations more than one step (or change to the value) can be facilitated at substantially the same time depending on the speed at which the attenuator cell is to transition to a different decibel level.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, ... ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips ... ), optical disks (e.g., compact disk (CD), digital versatile disk (DVD) ... ), smart cards, and flash memory devices (e.g., card, stick, key drive ... ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. An attenuator circuit, comprising:
a first branch comprising a first transistor and a second transistor;
a second branch comprising a third transistor; and
a third branch comprising a fourth transistor, wherein
while the first transistor and the second transistor are in a closed state and the third transistor and the fourth transistor are in an opened state, an attenuation level of the attenuator circuit has a first value,
transitioning the first transistor to an opened state causes the attenuation level to decrease from the first value to a second value,
subsequently transitioning the second transistor to an opened state causes the attenuation level to decrease from the second value to a third value,
subsequently transitioning the third transistor to a closed state causes the attenuation level to decrease from the third level to a fourth level, and
subsequently transitioning the fourth transistor to a closed state causes the attenuation level to decrease from the fourth level to zero or substantially zero.

2. The attenuator circuit of claim 1, wherein the first transistor, the second transistor, the third transistor, and the fourth transistor are controlled independently from one another.

3. The attenuator circuit of claim 1, further comprising:
a fifth transistor in series with the first transistor; and
a sixth transistor in series with the second transistor.

4. The attenuator circuit of claim 1, further comprising:
fifth transistor in parallel with a first resistor, wherein the first resistor is connected between the first transistor and an input port of the attenuator circuit; and
a sixth transistor in parallel with a second resistor, wherein the second resistor is connected between the second transistor and an output port of the attenuator circuit.

5. The attenuator circuit of claim 4, wherein
the fifth transistor is controlled to be in an opposite state to that of the first transistor, and
the sixth transistor is controlled to be in an opposite state to that of the second transistor.

6. The attenuator circuit of claim 4, further comprising:
a first group of clocks that control state transitions of the first transistor and the fifth transistor at respective timings that prevent the first transistor and the fifth transistor from having simultaneous closed states; and
a second group of clocks that control state transitions of the second transistor and the sixth transistor at respective timings that prevent the second transistor and the sixth transistor from having simultaneous closed states.

7. The attenuator circuit of claim 1, wherein
the attenuation level decreases from the first value to the second value by a step amount,
the attenuation level decreases from the second value to the third value by the step amount, and
the attenuation level decreases from the third value to the fourth value by the step amount.

8. The attenuator circuit of claim 1, wherein at least one of the first transistor, the second transistor, the third transistor, or the fourth transistor is a field-effect transistor.

9. A method, comprising:
controlling respective states of a first transistor, a second transistor, a third transistor, and a fourth transistor of an attenuator circuit to change an attenuation level of the attenuator circuit in a stepwise manner, wherein
the attenuator circuit comprises a first branch comprising the first transistor and the second transistor, a second branch comprising the third transistor, and a third branch comprising the fourth transistor, and
the controlling comprises, subsequent to placing the first transistor and the second transistor in closed states and placing the third transistor and the fourth transistor in opened states:
placing the first transistor in an opened state, wherein the placing of the first transistor in the opened state causes the attenuation level to decrease from a first level to a second level,
placing the second transistor in an opened state, wherein the placing of the second transistor in the opened state causes the attenuation level to decrease from the second level to a third level;
placing the third transistor in a closed state, wherein the placing of the third transistor in the closed state causes the attenuation level to decrease from the third level to a fourth level; and
placing the fourth transistor in a closed state, wherein the placing of the fourth transistor in the closed state causes the attenuation level to decrease from the fourth level to zero or substantially zero.

10. The method of claim 9, wherein the controlling further comprises, subsequent to placing the first transistor in the opened state, placing the second transistor in the opened state, placing the third transistor in the closed state, and placing the fourth transistor in the closed state:
placing the fourth transistor in an opened state, wherein the placing of the fourth transistor in the opened state causes the attenuation level to increase to the fourth level;
placing the third transistor in an opened state, wherein the placing of the third transistor in the opened state causes the attenuation level to increase from the fourth level to the third level;

placing the second transistor in a closed state, wherein the placing of the second transistor in the closed state causes the attenuation level to increase from the third level to the second level; and placing the first transistor in a closed state, wherein the placing of the first transistor in the closed state causes the attenuation level to increase from the second level to the first level.

11. The method of claim 9, wherein the attenuator circuit further comprises a first capacitor in parallel with the first transistor, and a second capacitor in parallel with the second transistor.

12. The method of claim 9, wherein the attenuator circuit further comprises:
a fifth transistor in parallel with a first resistor, wherein the first resistor is connected between the first transistor and an input port of the attenuator circuit; and
a sixth transistor in parallel with a second resistor, wherein the second resistor is connected between the second transistor and an output port of the attenuator circuit.

13. The method of claim 12, further comprising:
controlling the fifth transistor to be in an opposite state to a current state of the first transistor; and
controlling the sixth transistor to be in an opposite state to a current state of the second transistor.

14. The method of claim 12, further comprising:
controlling state transitions of the first transistor and the fifth transistor at respective timings that prevent the first transistor and the fifth transistor from having simultaneous closed states; and
controlling state transitions of the second transistor and the sixth transistor at respective timings that prevent the second transistor and the sixth transistor from having simultaneous closed states.

15. The method of claim 9, wherein
the first level and the second level differ by a step amount,
the second level and the third level differ by the step amount, and the third level and the fourth level differ by the step amount.

16. An attenuator circuit, comprising:
a first branch comprising:
a first transistor in a path between an input port and ground, and a second transistor in a path between an output port and ground; and
one or more capacitors that provide off state parasitic FET capacitance in the first branch;
a second branch comprising a third transistor in a path between the input port and the output port;
a third branch comprising a fourth transistor in a path between the input port and the output port;
a fifth transistor in a path between the input port and the first transistor; and
a sixth transistor in a path between the output port and the second transistor;
wherein
states of the first transistor, the second transistor, the third transistor, and the fourth transistor are independently controllable, and
an attenuation level between the input port and the output port is controlled in a stepwise manner based on states of the first transistor, the second transistor, the third transistor, and the fourth transistor.

17. The attenuator circuit of claim 16, wherein the attenuation level is settable to a selected one of at least three values based on the states of the first transistor, the second transistor, the third transistor, and the fourth transistor.

18. The attenuator circuit of claim 16, wherein
while the first transistor and the second transistor are in closed states and the third transistor and the fourth transistor are in opened states, the attenuation level has a first value,
transitioning the first transistor to an opened state causes the attenuation level to decrease by a step amount from the first value to a second value,
subsequently transitioning the second transistor to an opened state causes the attenuation level to decrease by the step amount from the second value to a third value,
subsequently transitioning the third transistor to a closed state causes the attenuation level to decrease by the step amount from the third value to a fourth value, and
subsequently transitioning the fourth transistor to a closed state causes the attenuation level to decrease by the step amount from the fourth value to zero or substantially zero.

19. The attenuator circuit of claim 16, wherein the one or more capacitors comprises:
a first capacitor comprising a first end connected to a drain of the first transistor and a second end connected to a source of the first transistor; and
a second capacitor comprising a first end connected to a drain of the second transistor and a second end connected to a source of the second transistor.

20. The attenuator circuit of claim 16, wherein:
the fifth transistor is provided in parallel with a first resistor, wherein the first resistor is connected between the first transistor and the input port; and
the sixth transistor is provided in parallel with a second resistor, wherein the second resistor is connected between the second transistor and the output port.

* * * * *